US012690325B2

(12) United States Patent
Wu et al.

(10) Patent No.: US 12,690,325 B2
(45) Date of Patent: *Jul. 21, 2026

(54) POLARIZER-FREE LED DISPLAYS

(71) Applicant: Applied Materials, Inc., Santa Clara, CA (US)

(72) Inventors: Chung-Chih Wu, Taipei (TW); Po-Jui Chen, Taipei (TW); Hoang Yan Lin, Taipei (TW); Guo-Dong Su, Taipei (TW); Wei-Kai Lee, Taipei (TW); Chi-Jui Chang, Taichung (TW); Wan-Yu Lin, Taipei (TW); Byung Sung Kwak, Mountain View, CA (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 89 days.

This patent is subject to a terminal disclaimer.

(21) Appl. No.: 18/642,519

(22) Filed: Apr. 22, 2024

(65) Prior Publication Data

US 2024/0284703 A1 Aug. 22, 2024

Related U.S. Application Data

(63) Continuation of application No. 17/493,508, filed on Oct. 4, 2021, now Pat. No. 11,968,856.

(51) Int. Cl.
| | |
|---|---|
| *H10K 50/858* | (2023.01) |
| *H10K 50/86* | (2023.01) |
| *H10K 71/00* | (2023.01) |

(52) U.S. Cl.
CPC ......... *H10K 50/858* (2023.02); *H10K 50/865* (2023.02); *H10K 71/00* (2023.02)

(58) Field of Classification Search
CPC ..... H10K 50/858; H10K 50/865; H10K 71/00
(Continued)

(56) References Cited

U.S. PATENT DOCUMENTS

| | | | |
|---|---|---|---|
| 11,968,856 B2 * | 4/2024 | Wu | ...................... H10K 50/865 |
| 2014/0203248 A1 | 7/2014 | Zhou et al. | |

(Continued)

FOREIGN PATENT DOCUMENTS

| | | |
|---|---|---|
| CN | 111769211 A | 10/2020 |
| CN | 111864092 A | 10/2020 |

(Continued)

OTHER PUBLICATIONS

U.S. Appl. No. 17/493,508 , Final Office Action, Mailed On Jun. 8, 2023, 13 pages.

(Continued)

*Primary Examiner* — Nduka E Ojeh
(74) *Attorney, Agent, or Firm* — Kilpatrick Townsend & Stockton LLP

(57) ABSTRACT

Exemplary subpixel structures include a directional light-emitting diode structure characterized by a full-width-half-maximum (FWHM) of emitted light having a divergence angle of less than or about 10°. The subpixel structure further includes a lens positioned a first distance from the light-emitting diode structure, where the lens is shaped to focus the emitted light from the light-emitting diode structure. The subpixel structure still further includes a patterned light absorption barrier positioned a second distance from the lens. The patterned light absorption barrier defines an opening in the barrier, and the focal point of the light focused by the lens is positioned within the opening. The subpixels structures may be incorporated into a pixel structure, and pixel structures may be incorporated into a display that is free of a polarizer layer.

18 Claims, 4 Drawing Sheets

(58) Field of Classification Search
USPC ........................................................ 257/40
See application file for complete search history.

(56) References Cited

U.S. PATENT DOCUMENTS

| | | | |
|---|---|---|---|
| 2015/0084026 A1* | 3/2015 | Miyamoto | H10K 59/879 |
| | | | 257/40 |
| 2016/0085118 A1 | 3/2016 | Lee | |
| 2018/0267344 A1* | 9/2018 | Wu | G02B 6/0036 |
| 2018/0267362 A1* | 9/2018 | Gahagan | G02F 1/133512 |

FOREIGN PATENT DOCUMENTS

| | | |
|---|---|---|
| CN | 113168079 A | 7/2021 |
| TW | I452360 B | 9/2014 |

OTHER PUBLICATIONS

U.S. Appl. No. 17/493,508 , Non-Final Office Action, Mailed On Feb. 21, 2023, 13 pages.
U.S. Appl. No. 17/493,508 , Notice of Allowance, Mailed On Dec. 21, 2023, 10 pages.
Application No. PCT/US2022/044630 , International Preliminary Report on Patentability, Mailed On Apr. 18, 2024, 7 pages.
Application No. PCT/US2022/044630 , International Search Report and Written Opinion, Mailed On Jan. 18, 2023, 10 pages.
Application No. TW111137463 , Notice of Decision to Grant, Mailed On Jan. 22, 2024, 4 pages.
Application No. TW111137463 , Office Action, Mailed On Jul. 7, 2023, 15 pages.
Application No. TW113114912, Decision to Grant, Mailed Sep. 2, 2024, 6 pages.

* cited by examiner

200

Form Light-Emitting Structure 205

Form Median Layers 210

Form Lenses 215

Form Color Filters 220

Form Patterned Light Absorption Layer 225

Form Cover Layer 230

Incorporate Light-Emitting Pixel into Display 235

300

400

POLARIZER-FREE LED DISPLAYS

CROSS-REFERENCE TO RELATED APPLICATION

This application is a continuation of U.S. application Ser. No. 17/493,508, filed Oct. 4, 2021, which is hereby incorporated by reference in its entirety for all purposes.

TECHNICAL FIELD

The present technology relates to light-emitting diode (LED) structures and fabrication processes. More specifically, the present technology relates to LED displays and methods of making them.

BACKGROUND

Light-emitting-diode (LED) display devices made from millions of micron-sized pixels are made possible by fabrication processes that produce intricately patterned material layers on substrate surfaces. Producing patterned material on a substrate requires controlled methods for deposition and removal of materials. However, with new device designs, producing high-quality layers of material with very precise dimensions may be challenging.

Thus, there is a need for improved systems and methods that can be used to produce high-quality materials and structures for LED display devices. These and other needs are addressed by the present technology.

SUMMARY

The present technology includes embodiments of a subpixel structure that includes a directional light-emitting diode structure characterized by a full-width-half-maximum (FWHM) of emitted light having a divergence angle of less than or about 10°. The subpixel structure further includes a lens positioned a first distance from the light-emitting diode structure, where the lens is shaped to focus the emitted light from the light-emitting diode structure. The subpixel structure still further includes a patterned light absorption barrier positioned a second distance from the lens. The patterned light absorption barrier defines an opening in the barrier, and the focal point of the light focused by the lens is positioned within the opening.

In additional embodiments, the light-emitting subpixel structure is free of a polarizer layer. In further embodiments, the light exiting the opening in the patterned light absorption barrier is characterized by a viewing angle that is greater than or about 45°. In still further embodiments, the first distance between the light-emitting diode structure and the lens is greater than the second distance between the lens and the patterned light absorption barrier. In yet additional embodiments, the lens is characterized by a diameter that is greater than or about 10 μm. In more embodiments, the opening defined in the patterned light absorption barrier is characterized by a width of less than or about 10 μm. In still more embodiments, the pattern light absorption barrier is characterized by a thickness that is less than or about 1 μm. In yet further embodiments, the light-emitting diode structure comprises an organic light-emitting diode structure.

The present technology also includes embodiments of a light-emitting pixel structure that includes a light emission layer that further includes a group of light-emitting diode structures. The light-emitting pixel structure may also include a patterned light absorption barrier that further includes a group of openings in the barrier. Each of the openings permit the transmission of light emitted from one of the light-emitting diode structures through the patterned light absorption barrier. The light-emitting pixel structure may further include a lens layer positioned between the light emission layer and the patterned light absorption barrier. The lens layer may include a group of lenses, wherein the lenses are shaped to concentrate the light emitted from the light-emitting diode structures into the openings of the patterned light absorption barrier. The light-emitting pixel structure is also free of a polarizer layer.

In additional embodiments, each of the light-emitting diode structures may be characterized by a full-width-half-maximum (FWHM) of emitted light having a divergence angle of less than or about 10°. In further embodiments, the light exiting the light-emitting pixel structure may be characterized by a viewing angle that is greater than or about 45°. In still further embodiments, the light-emitting pixel structure is greater than or about 50% brighter than the light-emitting pixel structure with a polarizing layer. In yet additional embodiments, each of the lenses in the lens layer may be characterized by a ratio of a focal point of the lens to a diameter of the lens that is less than or about 1:1. In more embodiments, the group of light-emitting diode structures may include organic light-emitting diode structures.

The present technology further includes embodiments of methods of forming light-emitting pixels. The methods may include forming a light emission layer on a substrate, where the light emission layer includes a group of light-emitting diode structures. The methods may also include forming a lens layer over the light emission layer, where the lens layer includes a group of lenses operable to concentrate the light emitted from the light-emitting diode structures, and where the lens layer is positioned a first distance from the light emission layer. The methods may further include forming a patterned light absorption barrier over the lens layer. The patterned light absorption barrier defines a group of openings in the barrier to transmit light from the group of light-emitting diode structures through the barrier, and may be positioned a second distance from the lens layer. In the light-emitting pixels, the first distance between the light emission layer and the lens layer may be greater than the second distance between the lens layer and the patterned light absorption barrier.

In additional embodiments, the patterned light absorption barrier may be formed by depositing a layer of light-absorbing material over the lens layer, where the layer of light-absorbing material may be characterized by an optical density of greater than or about 2 μm⁻¹. Openings may be formed in the layer of light-absorbing material to make the patterned light absorption barrier. The openings may have a width of less than or about 1 μm. In further embodiments, each of the light-emitting diode structures may be operable to emit directional light characterized by a full-width-half-maximum (FWHM) having a divergence angle of less than or about 10°. In still further embodiments, the light exiting the light-emitting pixel may be characterized by a viewing angle that is greater than or about 45°. In yet additional embodiments, the light-emitting pixel is free of a polarizer layer, where the light-emitting pixel is greater than or about 50% brighter than the light-emitting pixel with a polarizer layer. In more embodiments, the light-emitting pixel may include an organic light-emitting pixel.

Such technology may provide numerous benefits over conventional LED pixels and the displays made with those pixels. For example, embodiments of the present subpixels and pixels eliminate the need to include a polarizer layer in the display. Polarizer layers can block as much as 60% of the light generated by the pixels, so a pixel structure that is free from a polarizer layer may be up to 60% brighter than the pixel structure having a polarizer layer. In further embodiments, the present subpixels and pixels include highly directional light-emitting diode structures and a lens-and-pinhole combination that can spread the directional light over a wide viewing angle. This allows more light emitted by the light-emitting diode structures to be included in a displayed image without restricting the viewing angle of the image to an undesirably small degree. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
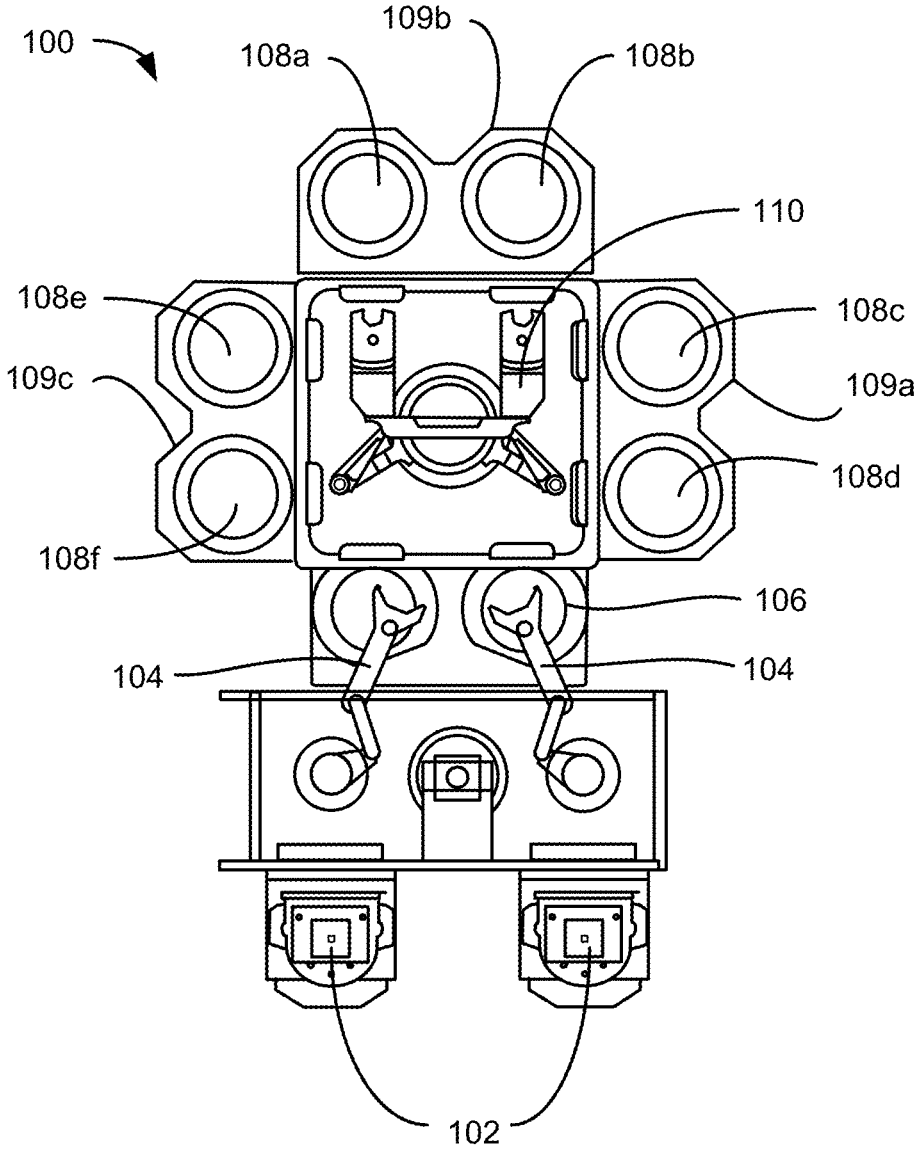
FIG. 1 shows a top plan view of one embodiment of an exemplary processing system according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

An LED display includes an array of light-emitting diode structures that can convert electrical current supplied by an electrical power source into emitted light that forms an image on the display. The energy pathway from the electrical current to the emitted light includes many unproductive exits, including the loss of energy during the passage of electrons, holes, and other charge carriers into an active region of the LED (i.e., injection efficiency), and the transfer of the current energy down non-radiative pathways (i.e., internal quantum efficiency). In many instances, the greatest energy losses occur from light generated by the LED structures that cannot be put to productive use because the light rays are traveling in the wrong direction or have the wrong phase (i.e., extraction efficiency). Conventional LED structures that emit light in many different directions are said to have low directionality. LED structures characterized by low directionality have a lower percentage of light emitted in a useful direction that helps produce an image on a display.

LED structures with low directionality can also have more optical crosstalk between subpixels as the stray light from one pixel overlaps and interferes with the emitted light of an adjacent subpixel. In many conventional LED structures, the optical crosstalk is reduced by placing a polarizer layer on the structures to block uncollimated light from reaching a display surface. The polarizer layer can also block a significant portion of the ambient light from the external environment that is reflected by the display. This reflected ambient light can reduce the ambient contrast ratio between the effective light emitted by the LED structures in the display and the reflected ambient light from the external environment. A polarizer layer is incorporated into the display to reduce the ambient light reflected by the display and increase the display's ambient contrast ratio. In many types of LED displays, including many types of OLED displays, the ambient contrast ratio without a polarizer layer may be so low in bright viewing environments, such as an outside daylight environment, that the display is unwatchable.

Unfortunately, there is a large tradeoff when using a polarizer layer to reduce optical crosstalk and increase the ambient contrast ratio in an LED display. The polarizer layer blocks as much as 60% of the light emitted by the LED structures, resulting in a noticeably dimmer display of an image. This not only reduces the brightness of the display, it also lowers the gains in the ambient contrast ratio that comes from the polarizer layer reducing the reflectance of the external ambient light from the display. Compensating for the loss of brightness results in substantially lower quantum efficiencies (e.g., wall-plug efficiency), among other problems, for LED displays using polarizer layers.

One approach to improving the efficiencies of LED structures has been to increase the directionality of the light emitted by the structures. When more of the light emitted by the LED structure is directed towards forming an image on the display, less extra electrical power is needed to compensate for the light blocked by the polarizer layer. When the light emitted by the LED is highly directional, the optical crosstalk between adjacent subpixels is inherently lower and the ambient contrast ratio is increased due to the increase in the intensity of the emitted light relative to the external ambient light. This reduces the need for a polarizer layer in the display. Unfortunately, there is also a tradeoff between the directionality of the emitted light and its viewing angle: highly directional light typically has a narrow viewing angle that can make a display difficult to watch from angles other than a 0° angle of inclination. Thus, many highly directional LED structures can produce brighter images than conventional LED structures that emit less directional light, but the images have a narrower viewing angle.

Embodiments of the present technology address the tradeoff between highly directional light and narrow viewing angles incorporating a lens-and-pinhole structure into the subpixels and pixels of the display. In embodiments, the highly directional light emitted by the LED structure is focused through a lens into an opening defined by a patterned light absorption layer. The focal point of the lens is in the opening, and from that point, the light exits the opening with a significantly wider angle of divergence. In embodiments, the light emitted from the opening is characterized by a viewing angle of greater than or about 45°.

Because the initial light emitted by the LED structure is highly directional, the optical crosstalk generated by adjacent subpixels is low, and the ambient contrast ratio is high even without a polarizer layer. Embodiments of the present technology are polarizer layer free to increase the brightness of displayed images by greater than or about 50% compared to images generated by comparable LED displays that use a polarizer layer.

FIG. 1 shows a top plan view of one embodiment of a processing system 100 of deposition, etching, baking, and curing chambers according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations, including the physical vapor deposition processes described herein, in addition to dry etch processes, cyclical layer deposition processes, atomic layer deposition processes, chemical vapor deposition processes, including metal-organic chemical vapor deposition processes, etch processes, pre-clean processes, planarizing processes including chemical-mechanical-polishing processes, anneal processes, plasma processing processes, degas processes, orientation processes, and other semiconductor fabrication processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to planarize, anneal, cure, or treat the deposited films. In another configuration, all three pairs of chambers, for example 108a-f, may be configured to both deposit and cure a film on the substrate. One or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems that may provide access to multiple processing chambers while maintaining a vacuum environment in various sections, such as the noted holding and transfer areas, may allow operations to be performed in multiple chambers while maintaining a particular vacuum environment between discrete processes.

Figure 2:
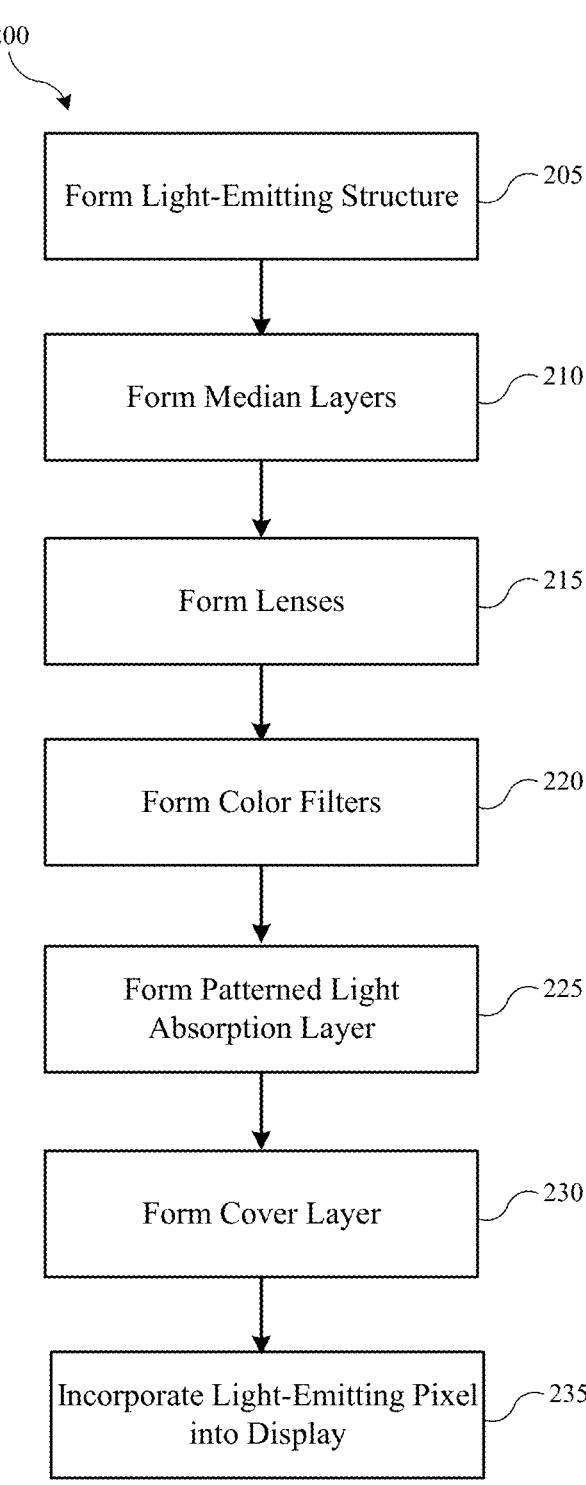
FIG. 2 shows exemplary operations in a method of forming LED semiconductor devices according to some embodiments of the present technology.

System 100, or more specifically chambers incorporated into system 100 or other processing systems, may be used to produce subpixels and pixels according to some embodiments of the present technology. FIG. 2 shows exemplary operations in method 200 of forming a pixel according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations, which may or may not be specifically associated with some embodiments of methods according to the present technology.

Figure 3:
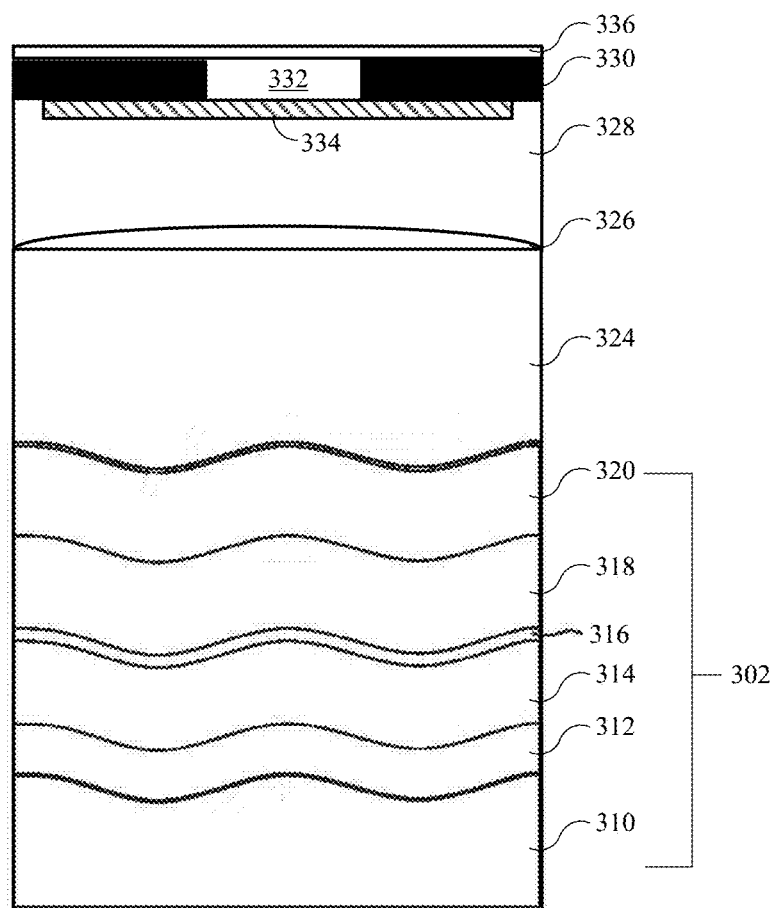
FIG. 3 shows cross-sectional views of a semiconductor LED subpixel structure according to embodiments of the present technology.

FIG. 2 shows exemplary operations in a method 200 of forming light-emitting pixel structures according to some embodiments of the present technology. Method 200 may be used to make the subpixel structure 300 shown in FIG. 3 and the pixel structure 400 shown in FIG. 4. Method 200 may include forming a light-emitting structure at operation 205. In embodiments, operation 205 may include forming the organic light-emitting diode (OLED) structure 302 in subpixel 300 and forming the light-emitting structures 404, 406, and 408, in pixel 400. In further embodiments, operation 205 may include providing a substrate 310 upon which the layers of an OLED structure 302 is formed, including a first (e.g., bottom) electrode layer 312, a group of organic layers 314, 316, 318, and second (e.g., top) electrode layer 320. In more embodiments, the OLED structure 302 is designed to generate light from an emissive organic layer (e.g., organic layer 316) upon the flow charge carriers (e.g., electrons and holes) between the first and second electrodes 312 and 320. The light emitted by the emissive organic layer 316 may be characterized by a peak wavelength intensity in a portion of the visible spectrum. In embodiments, the emissive organic layer 316 may be characterized by a peak wavelength intensity of about 620 nm to 750 nm (red light), about 495 nm to about 570 nm (green light), or about 450 nm to 495 nm (blue light), among other peak wavelength intensities. The emissive organic layer 316 is operable to generate light with a peak wavelength intensity that depends on the types and amounts of organic molecules in the layer that emit light after being activated by the charge carriers.

In additional embodiments, the substrate 310 in OLED structure 302 may be made from one or more of silicon oxide (a.k.a. glass), plastic, metal foil such as aluminum or copper foil among other metal foils, and organic polymers such as polyethylene terephthalate (PET), polyethylene naphthalate (PEN), or polyimide (PI), among other organic polymers. In further embodiments, the substrate 310 may be a planar substrate layer that includes one or more control device structures for generating images on a display device. In embodiments, the control device structures may include device layers such as buffer layers, interlayer dielectric layers, insulating layers, active layers, and electrode layers, among other kinds of layers. In more embodiments, the control device structures may include one or more types of display driving backplane circuits. In still more embodiments, the substrate 310 may be transparent to wavelengths of light generated by the emissive organic layer 316 of the OLED structure 302.

In further embodiments, the first electrode layer 312 may be in contact with a surface of the substrate 310. In still further embodiments, the first electrode layer 312 may be an electrically conductive layer made from one or more types of electrically conductive material. In embodiments, the first electrode layer 312 may be made from at least one material, such as a conductive oxide or a metal. In additional embodiments, the conductive oxides may include indium-tin-oxide (ITO), indium-zinc-oxide (IZO), fluorine-doped tin oxide (FTO), and doped zinc oxide, among other conductive oxides. In yet additional embodiments, the metals may include silver, gold, magnesium, aluminum, copper, and tin, among other metals.

In more embodiments, a group of organic layers 314, 316, and 318 may be positioned on the first electrode layer 312 in the OLED structure 302. In embodiments, the organic layers may include a hole transport layer 314, and an emissive layer 316, and an electron transport layer 318. In additional embodiments, the hole transport layer 314 may be in contact with the first electrode layer 312, which may be acting as a positively biased anode electrode. The positively charged holes originating in the first electrode layer 312 may be transported through the hole transport layer 314 into the emissive layer 316. In further embodiments, the electron transport layer 318 may be in contact with the second electrode layer 320, which may be acting as a negatively biased cathode electrode. The negatively charged electrons originating in the second electrode layer 320 may be transported through the electron transport layer 318 into the emissive layer 316. In yet further embodiments, the holes and electrons traveling through the hole and electron transport layers 314 and 318 may recombine in the emissive layer 316 through a charge transfer pathway that activates light-emitting compounds in the emissive layer to emit light. In further embodiments, the group of organic layers may also include a hole injection layer (not shown) positioned between the first electrode layer 312 and the hole transport layer 314. In still further embodiments, the group of organic layers may further include an electron injection layer (not shown) positioned between the second electrode layer 320 and the electron transport layer 318.

In more embodiments, the organic layer 314 may include N,N'-di(1-naphthyl)-N,N'-diphenyl-(1,1'-biphenyl)-4,4'-diamine (NPB), among other organic compounds. In yet more embodiments, the organic layer 314 may be characterized by a non-zero thickness less than or about 300 nm, less than or about 200 nm, less than or about 150 nm, less than or about 120 nm, less than or about 100 nm, less than or about 75 nm, less than or about 50 nm, or less. In still more embodiments, organic layer 316 may include 4,4'-bis(N-carbazolyl)-1,1'-biphenyl (CBP), among other organic compounds. In additional embodiments, the organic layer 516 may be characterized by a non-zero thickness less than or about 50 nm, less than or about 40 nm, less than or about 30 nm, less than or about 20 nm, less than or about 10 nm, or less. In further embodiments, organic layer 318 may include 2,2',2"-(1,3,5-benzenetriyl)-tris(1-phenyl-1-H-benzimidazole) (TPBi), among other organic compounds. In still further embodiments, the organic layer 318 may be characterized by a non-zero thickness less than or about 300 nm, less than or about 200 nm, less than or about 140 nm, less than or about 120 nm, less than or about 100 nm, less than or about 75 nm, less than or about 50 nm, less than or about 20 nm, or less. In more embodiments, the hole injection layer may include hexanitrile hexaazatriphenylene (HATCN), among other organic compounds. In yet more embodiments, the electron injection layer may include a lithium fluoride (LiF) layer, and a magnesium silver (Mg:Ag) layer, among other kinds of layers.

In embodiments, the OLED structure 302 may be characterized by corrugated surfaces in one or more of the substrate 310, organic layers 314, 316, and 318, and electrode layers 312, 320. In further embodiments, the corrugated surfaces may be characterized by a wave pattern that has a height and periodicity that is coupled to the dimensions of a waveguide cavity in the emissive layer 316 to bias the emission of light with an increased directionality and increased monochromaticity. In embodiments, the highly-directional light emitted by the OLED structure 302 may be characterized by a small divergence angle (e.g., divergence angle θ in FIG. 4). In additional embodiments, the highly-directional light may be characterized by a divergence angle of less than or about 10°, less than or about 9°, less than or about 8°, less than or about 7°, less than or about 6°, less than or about 5°, less than or about 4°, less than or about 3°, less than or about 2°, less than or about 10, or less. In further embodiments, the highly-monochromatic light emitted by the OLED structure 302 may be characterized by a full-width-half-maximum (FWHM) distribution of less than or about 150 nm, less than or about 100 nm, less than or about 75 nm, less than or about 50 nm, or less.

Figure 4:
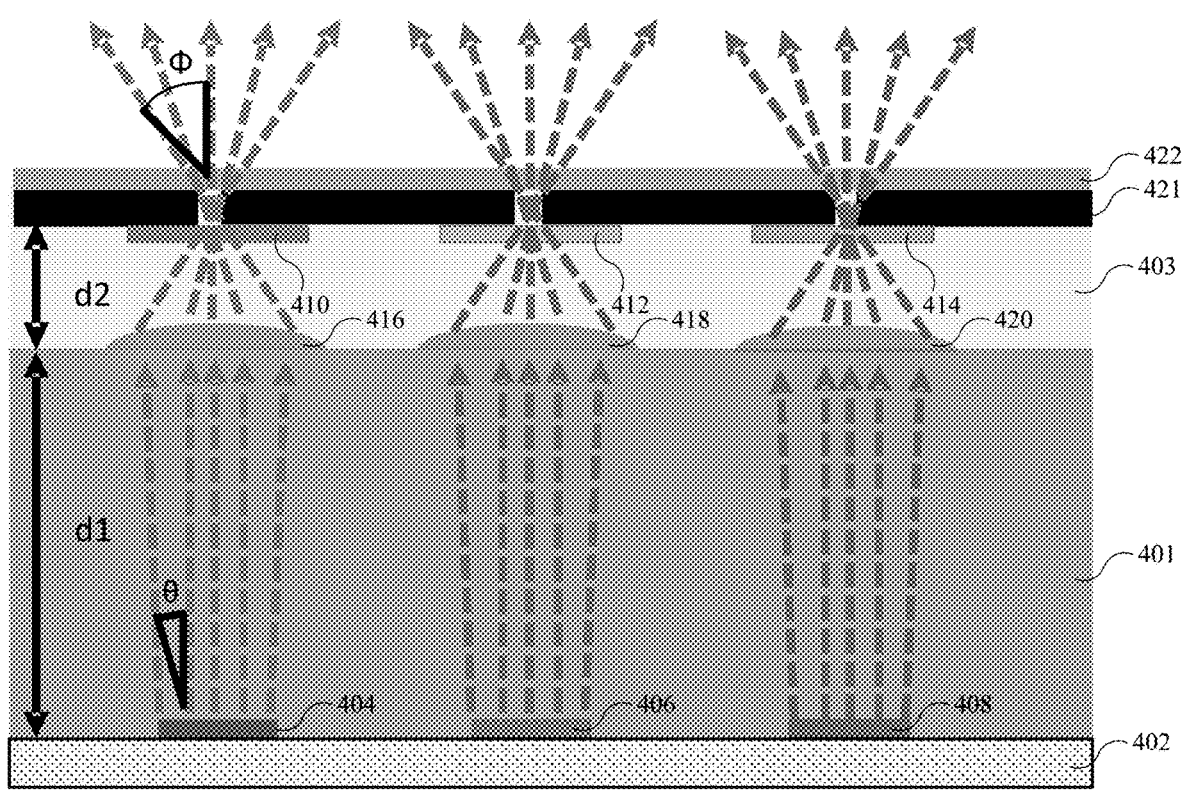
FIG. 4 shows a cross-sectional view of a semiconductor LED pixel structure according to additional embodiments of the present technology.

In embodiments, a group of light-emitting structures like OLED structure 302 may be formed into a light emission layer. FIG. 4 shows light-emitting structures 404, 406, and 408 formed into a light emission layer on substrate 402 in pixel 400. In additional embodiments, the light emission layer may include greater than or about 2 light-emitting structures, greater than or about 3 light-emitting structures, greater than or about 5 light-emitting structures, greater than or about 10 light-emitting structures, greater than or about 20 light-emitting structures, greater than or about 30 light-emitting structures, greater than or about 40 light-emitting structures, greater than or about 50 light-emitting structures, greater than or about 100 light-emitting structures, or more. In further embodiments, each of the light-emitting structures may be characterized by a width of less than or about 100 μm, less than or about 90 μm, less than or about 80 μm, less than or about 70 μm, less than or about 60 μm, less than or about 50 μm, less than or about 40 μm, less than or about 30 μm, less than or about 20 μm, less than or about 10 μm, or less. In yet further embodiments, the light-emitting structures may be separated from each other by an edge-to-edge distance of less than or about 100 μm, less than or about 75 μm, less than or about 50 μm, less than or about 40 μm, less than or about 30 μm, less than or about 20 μm, less than or about 10 μm, less than or about 5 μm, or less.

Method 200 may include forming one or more median layers on the light-emitting structures at operation 210. In the embodiment shown in FIG. 3, median layers 324, 328 are formed on the light-emission structure 302. In FIG. 4, median layers 401, 403 separate the light-emitting structures 404, 406, and 408 from the color filters 410, 412, and 414, and the patterned light absorption barrier 421. In embodiments, the number of median layers formed on the light-emitting structures may be greater than or about one, greater than or about two, greater than or about three, greater than or about four, greater than or about five, or more. In further embodiments, the distance between a light emission layer and a pattered light absorption barrier that is created by the one or more median layers may be greater than or about 50 μm, greater than or about 60 μm, greater than or about 70 μm, greater than or about 80 μm, greater than or about 90 μm, greater than or about 100 μm, greater than or about 120 μm, greater than or about 150 μm, greater than or about 180 μm, greater than or about 200 μm, or more.

In additional embodiments, the one or more median layers formed in operation 210 may include the formation of a multi-layer structure that includes a thin-film-encapsulation (TFE) and one or more organic layers. In further embodiments, the median layers 304 may be characterized as a multi-layer structure that includes a combination of dielectric layers and organic layers. In embodiments, the median layers 304 may include dielectric layers and organic layers. In additional embodiments, the dielectric layers may include one or more dielectric materials such as silicon nitride, silicon oxide, silicon-oxy-nitride, and aluminum oxide, among other dielectric oxide materials. In yet additional embodiments, the organic layers may include acrylic polymers. In more embodiments, the median layers may alternate between layers having a high and low refractive index. In embodiments, the dielectric layers may be characterized by refractive indexes of greater than or about 1.6, greater than or about 1.7, greater than or about 1.8, or more. In additional embodiments, the organic layers may be characterized by refractive indexes of less than or about 1.5, less than or about 1.4, less than or about 1.3, or less.

Method 200 may additionally include forming lenses between or over the median layers in operation 215. In embodiments, the lenses may include lens 326 in subpixel 300 and lenses 416, 418, and 420 in pixel 400. In further embodiments, the lenses may be formed at a first distance from the light-emitting structures (e.g., distance "d1" in FIG. 4). In embodiments, the first distance may be less than or about 100 μm, less than or about 90 μm, less than or about 80 μm, less than or about 70 μm, less than or about 60 μm, less than or about 50 μm, or less. In additional embodiments, the lenses may have a planar (a.k.a., horizontal) base with a circular or elliptical shape. In still additional embodiments, the lenses may be characterized by a horizontal diameter that is less than or about 100 μm, less than or about 75 μm, less than or about 50 μm, less than or about 25 μm, less than or about 10 μm, less than or about 5 μm, or less. In yet more embodiments, the lenses may be characterized by a vertical height that is less than or about 10 μm, less than or about 9 μm, less than or about 8 μm, less than or about 7 μm, less than or about 6 μm, less than or about 5 μm, less than or about 4 μm, less than or about 3 μm, less than or about 2 μm, less than or about 1 μm, or less. In more embodiments, the lenses may have a horizontal diameter that spans the width of the light-emitting structure that provides the emitted light the lens is focusing.

In embodiments, the lenses may be shaped to focus the light from the light-emitting structure to a focal point located within an opening defined by a patterned light absorption layer. In further embodiments, this focal point may be positioned a second distance between the base of the lens and the opening (e.g., distance "d2" in FIG. 4). In embodiments, the second distance may be greater than or about 1 μm, greater than or about 5 μm, greater than or about 10 μm, greater than or about 20 μm, greater than or about 30 μm, greater than or about 40 μm, greater than or about 50 μm, greater than or about 60 μm, greater than or about 70 μm, greater than or about 80 μm, greater than or about 90 μm, greater than or about 100 μm, or more. In more embodiments, the second distance may be approximately the same as the diameter of the lens.

In further embodiments, the lenses may be formed from materials that have a higher refractive index than surrounding materials, such as the materials of the median layers in contact with the lenses. In embodiments, the lenses may be characterized by a refractive index greater than the refractive indexes of the surrounding materials by an amount that is greater than or about 0.2, greater than or about 0.3, greater than or about 0.4, greater than or about 0.5 or more. In more embodiments, the lenses may be characterized by a refractive index that is greater than or about 1.5, greater than or about 1.6, greater than or about 1.7, greater than or about 1.8, or more. In yet more embodiments, the lenses may be made from an organic polymer, and organic resin, or an inorganic dielectric material such as silicon oxide.

In additional embodiments, the lenses may be shaped and positioned to focus the light emitted from a light-emitting structure onto a focal point within an opening defined in the patterned light absorption layer. In further embodiments, the focal point may be positioned in the opening to provide a threshold viewing angle of the light exiting the opening (e.g., viewing angle Φ in FIG. 4). In more embodiments, the light exiting the opening may be characterized by a viewing angle that is greater than or about 10°, greater than or about 15°, greater than or about 20°, greater than or about 25°, greater than or about 30°, greater than or about 35°, greater than or about 40°, greater than or about 45°, greater than or about 50°, greater than or about 55°, greater than or about 60°, greater than or about 65°, greater than or about 70°, greater than or about 75°, greater than or about 80°, greater than or about 85°, greater than or about 90°, or more. As noted above, the lens-and-opening design in embodiments of the present technology may expand the viewing angle of the highly directional light initially emitted by the light-emitting structures.

Method 200 may further include forming color filters over the median layers in operation 215. In embodiments, the color filters may include color filter 326 in subpixel 300 and color filters 410, 412, and 414 in pixel 400. In further embodiments, the color filters may be operable to transmit light of a proximately positioned light-emitting structure and block the transmission of light at other wavelengths. In additional embodiments, the color filters may make contact with a patterned light absorption layer (e.g., layer 330, 421). In still additional embodiments, each color filter may span the width of an opening defined by the patterned light absorption layer.

Method 200 may additionally include forming a patterned light absorption layer on the median layers at operation 220. The patterned light absorption layer defines a group of openings in the layer that permit a portion of the light from light-emitting structures to travel through the light absorption layer. In embodiments, these openings may include opening 332 in the patterned light absorption layer 330 and the openings in the patterned light absorption layer 421. In additional embodiments, the patterned light absorption layer may be formed by depositing a light-blocking material on the median layers and color filters of one or more light-emitting pixels. In still additional embodiments, the light blocking material may be deposited as a blanket light-blocking layer having a thickness greater than or about 1 μm, greater than or about 2.5 μm, greater than or about 5 μm, greater than or about 7.5 μm, greater than or about 10 μm, or more. In more embodiments, the deposited light blocking material may be photo-lithographically patterned to form the openings in the patterned light absorption layer. In embodiments, each of the openings may be aligned with a light-emitting structure, as seen in the alignment of opening 332 with the light-emitting structure 302 and each of the openings with light-emitting structures 404, 406, and 408, respectively. In further embodiments, the alignment of the openings and the light-emitting structures may be characterized by the vertical alignment of a center position in an opening with a central position in a light-emitting structure. In still further embodiments, the openings patterned into the light absorption layer may include one or more shapes such as circular, elliptical, square, rectangular, and trapezoidal, among other shapes.

In more embodiments, the light blocking material may include a combination of an organic polymer matrix and a light-absorbing compound such as a light-absorbing pigment or carbon black. In still more embodiments, the patterned light absorption layer may be characterized by an optical density of greater than or about 2.0 $\mu m^{-1}$, greater than or about 2.25 $\mu m^{-1}$, greater than or about 2.5 $\mu m^{-1}$, greater than or about 2.75 $\mu m^{-1}$, greater than or about 3.0 $\mu m^{-1}$, greater than or about 3.25 $\mu m^{-1}$, greater than or about 3.5 $\mu m^{-1}$, greater than or about 3.75 $\mu m^{-1}$, greater than or about 4.0 $\mu m^{-1}$, or more.

In further embodiments, forming the patterned light absorption layer at operation 225 also includes forming openings in the as-deposited layer of light-blocking material. In embodiments, the openings may be characterized as "pinhole" openings with small widths relative to the total width of the patterned light absorption layer. In additional embodiments, the openings may be characterized by widths of less than or about 10 μm, less than or about 5 μm, less than or about 2.5 μm, less than or about 1 μm, less than or about 0.5 μm, or less. In further embodiments, the ratio of the width of the openings to the diameter of the lens may be less than or about 1:5, less than or about 1:10, less than or about 1:15, less than or about 1:20, less than or about 1:25, or less. In still further embodiments, the openings may be circular, elliptical, square, rectangular, and trapezoidal, among other shapes.

Method 200 may further include forming a cover layer on the patterned light absorption layer at operation 230. In embodiments, the cover layer may include one or more kinds of layers that include an anti-reflective layer and an anti-static layer.

Method 200 may still also include incorporating light-emitting pixels into a display at operation 235. In embodiments, operation 235 may include the placement of a matrix of light-emitting pixels on a backplane substrate that includes control devices for activating the individual sub-pixels of each of the light-emitting pixels. In further embodiments, the operation may further include placing a display screen on the matrix of light-emitting pixels. In still further embodiments, the display may be a television, a computer monitor, a smartphone, a tablet, or a screen display in a consumer electronics device, among other kinds of displays.

Embodiments of the present technology like method 200 to make subpixel 300 and pixel 400 include operations to make components of a polarizer-layer-free display with an increased extraction efficiency and a higher ambient contrast ratio compared to a conventional display that uses a polarizer layer. In embodiments, the pixels of the present technology may generate display images that are significantly brighter than the same image generated with the pixels dimmed by a polarizer layer. In further embodiments, displays incorporating the polarizer layer free pixels of the present technology may be characterized by an increased brightness that is greater than or about 25%, greater than or about 30%, greater than or about 35%, greater than or about 40%, greater than or about 45%, greater than or about 50%, greater than or about 55%, greater than or about 60%, or more than a comparable display having a polarizer layer. In still further embodiments, displays incorporating the polarizer layer free pixels of the present technology may be characterized by an increased ambient contrast ratio of greater than or about 10%, greater than or about 25%, greater than or about 30%, greater than or about 35%, greater than or about 40%, greater than or about 45%, greater than or about 50%, greater than or about 55%, greater than or about 60%, greater than or about 70%, greater than or about 80%, greater than or about 90%, greater than or about 100%, or more.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either of the limits, both of the limits, or neither of the limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a pixel" includes a plurality of such pixels, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A light-emitting subpixel structure comprising:
a directional light-emitting diode structure characterized by a full-width-half-maximum (FWHM) of emitted light having a divergence angle of less than or about 10°;
a lens shaped to focus the emitted light from the light-emitting diode structure; and
a patterned light absorption barrier that defines an opening in which a focal point of the emitted light focused by the lens is positioned within the opening.

2. The light-emitting subpixel structure of claim 1, wherein the light-emitting subpixel structure is free of a polarizer layer.

3. The light-emitting subpixel structure of claim 1, wherein the light exiting the opening in the patterned light absorption barrier is characterized by a viewing angle that is greater than or about 45°.

4. The light-emitting subpixel structure of claim 1, wherein a first distance between the light-emitting diode structure and the lens is greater than a second distance between the lens and the patterned light absorption barrier.

5. The light-emitting subpixel structure of claim 1, wherein the lens is characterized by a diameter that is greater than or about 10 μm.

6. The light-emitting subpixel structure of claim 1, wherein the opening defined in the patterned light absorption barrier is characterized by a width of less than or about 1 μm.

7. The light-emitting subpixel structure of claim 1, wherein the patterned light absorption barrier is characterized by a thickness that is less than or about 10 μm.

8. The light-emitting subpixel structure of claim 1, wherein the light-emitting diode structure comprises an organic light-emitting diode structure.

9. A light-emitting pixel structure comprising:

light-emitting diode structures;

a patterned light absorption barrier defining a group of openings in the barrier, wherein each of the openings permit transmission of light emitted from one of the light-emitting diode structures through the patterned light absorption barrier; and a plurality of lenses shaped to concentrate the light emitted from the light-emitting diode structures into the openings of the patterned light absorption barrier, wherein each lens in the plurality of lenses is characterized by a ratio of a focal point of the lens to a diameter of the lens that is less than or about 1:1.

10. The light-emitting pixel structure of claim 9, wherein each of the light-emitting diode structures is characterized by a full-width-half-maximum (FWHM) of emitted light having a divergence angle of less than or about 10°.

11. The light-emitting pixel structure of claim 9, wherein the light exiting the light-emitting pixel structure is characterized by a viewing angle that is greater than or about 45°.

12. The light-emitting pixel structure of claim 9, wherein the light-emitting pixel structure is greater than or about 50% brighter than a comparable light-emitting pixel structure with a polarizer.

13. The light-emitting pixel structure of claim 9, wherein the light-emitting diode structures comprise organic light-emitting diode structures.

14. A processing method to form a light-emitting pixel, the method comprising:

forming light-emitting diode structures over a substrate that are characterized by a full-width-half-maximum (FWHM) of emitted light having a divergence angle of less than or about 10°;

forming lenses over the light-emitting diode structures, wherein the lenses are operable to focus light emitted from the light-emitting diode structures; and forming a patterned light absorption barrier over the lenses, wherein the patterned light absorption barrier defines a group of openings in the barrier to transmit light from the light-emitting diode structures through the barrier such that focal points of the light focused by the lenses are positioned within the group of openings.

15. The method of claim 14, wherein the patterned light absorption barrier is formed by:

depositing a layer of a light-absorbing material over the lenses, wherein the layer of the light-absorbing material is characterized by an optical density greater than or about 2 $\mu m^{-1}$; and forming the openings in the layer of the light-absorbing material to make the patterned light absorption barrier, wherein the openings have a width of less than or about 1 $\mu m$.

16. The method of claim 14, wherein the light exiting the light-emitting pixel is characterized by a viewing angle that is greater than or about 45°.

17. The method of claim 14, wherein the light-emitting pixel is free of a polarizer layer, and wherein the light-emitting pixel is greater than or about 50% brighter than a comparable light-emitting pixel structure with a polarizer.

18. The method of claim 14, wherein the light-emitting pixel comprises an organic light-emitting pixel.

* * * * *